(12) United States Patent
Erck et al.

(10) Patent No.: US 6,522,940 B1
(45) Date of Patent: *Feb. 18, 2003

(54) METHOD AND SYSTEM FOR VARYING DIE SHAPE TO INCREASE WAFER PRODUCTIVITY

(75) Inventors: Wesley R. Erck, Danville, CA (US); Michael R. Magee, Los Gatos, CA (US); Michael D. Beer, San Jose, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 09/473,384

(22) Filed: Dec. 28, 1999

(51) Int. Cl.$^7$ ............................ G06F 19/00; G06F 17/50
(52) U.S. Cl. ....................... 700/121; 700/97; 700/171; 716/1; 716/8
(58) Field of Search ................. 700/97, 99, 121, 700/171; 438/129, 973, 982, 14, 460; 716/1, 2, 4, 8, 21

(56) References Cited

U.S. PATENT DOCUMENTS

| | | | | |
|---|---|---|---|---|
| 5,305,222 A | * | 4/1994 | Nakamura ................. | 355/53 |
| 5,444,538 A | * | 8/1995 | Pellegrini ................. | 355/53 |
| 5,459,340 A | | 10/1995 | Anderson et al. .......... | 257/203 |
| 5,654,792 A | | 8/1997 | Yonekawa ................. | 355/53 |
| 5,699,260 A | | 12/1997 | Lucas et al. ........... | 364/468.28 |
| 5,874,189 A | * | 2/1999 | Stroh et al. .............. | 430/22 |
| 6,064,759 A | * | 5/2000 | Buckley et al. ............. | 348/125 |

FOREIGN PATENT DOCUMENTS

| | | | | |
|---|---|---|---|---|
| EP | 0709740 A2 | 5/1996 | ............. | G03F/7/20 |
| EP | 0768575 A2 | 4/1997 | ............. | G03F/7/20 |

* cited by examiner

*Primary Examiner*—Leo Picard
*Assistant Examiner*—Elliott Frank
(74) *Attorney, Agent, or Firm*—Peter Zawilski

(57) ABSTRACT

A method and system thereof for maximizing integrated circuit die production. In an example embodiment, the method is implemented on a server computer system in a client-server computer system network. In this embodiment, the server computer system receives from a client computer system a wafer size, a scribe lane width, and the dimensions for a die. A die count and a stepper shot count corresponding to the dimensions are determined using one or more lookup tables. A lookup table is associated with each combination of wafer size and scribe lane width. A measure of die production is calculated using the die count and the stepper shot count and transmitted to the client computer system. The dimensions can be changed and a new measure of die production calculated using the changed dimensions, until a maximum value of the measure of die production is determined.

30 Claims, 7 Drawing Sheets

METHOD AND SYSTEM FOR VARYING DIE SHAPE TO INCREASE WAFER PRODUCTIVITY

TECHNICAL FIELD

The present invention relates to integrated circuit design and fabrication. More specifically, the present invention pertains to a method and system for maximizing the production of integrated circuit dies by varying die dimensions during design to maximize gross die per wafer and minimize stepper shot count during fabrication.

BACKGROUND ART

Integrated circuit dies are fabricated en masse on silicon wafers using well-known techniques such as photolithography. Using these techniques, a pattern that defines the size and shape of the components and interconnects within a given layer of the die is applied to the wafer. The pattern applied to the wafer is laid out in an array, or matrix, of reticle images. A wafer stepper holds the pattern over a wafer and projects the pattern image of the reticle onto the wafer. The area on the wafer upon which the image is projected is defined as a stepper shot. A multitude of interconnecting layers, one formed on top of another, are essentially built up on the integrated circuit dies using several passes through the stepper.

The gross number of dies that can be produced from a single wafer is, as would be expected, dependent on the size and shape of the individual dies. The number of stepper shots is dependent on the number of die images that can be placed in the printable field of the reticle, which in turn is dependent on the size and shape of the individual dies. Therefore, the number of stepper shots is also dependent on the size and shape of the individual dies.

Prior Art FIG. 1 illustrates a wafer 10 on which a pattern of dies, exemplified by die 22, have been laid out. In this example, die 22 is square shaped. If the size or shape of die 22 were changed, then the number of dies that would fit on wafer 10 would likely change.

Shot 20, in this example, consists of a five-by-five (5×5) die matrix that projects a shot image on a 5×5 array of dies. Consider the second row from the top of wafer 10. This row consists of five 5×5 arrays of dies, and so would require five 5×5 stepper shots to complete. A sixth stepper shot could be made onto region 30 of wafer 10; however, this sixth shot would not result in a total 5×5 array of dies being formed because region 30 is not of sufficient size, and so a portion of the sixth shot would overrun past the edge of the wafer. For the purpose of discussion, assume that the sixth shot forms six additional dies in region 30. Thus, for the first five shots, the output would be 25 dies per shot, while for the sixth shot, the output would be six dies. Therefore, the sixth shot, comprising an increase of 20 percent in the number of shots made, results in an increase of only about five percent in the number of dies produced.

Accordingly, it may not always be desirable to maximize the number of dies produced per wafer. If the fabrication facility wafer steppers are not being used to capacity, then it generally is appropriate to maximize the gross number of dies per wafer. On the other hand, if the fabrication facility is capacity limited by its wafer steppers, it may be more important to minimize the stepper shot count. When the fabrication facility is fully loaded, it may be beneficial to accept slightly fewer dies per wafer if the number of stepper shots is reduced as a result, thereby allowing more wafers to be processed during a given time frame and consequently producing a greater number of total dies.

However, the prior art is problematic because decisions may be made in the design phase without fully considering the effect on the fabrication phase. In the prior art, the design phase and the fabrication phase of the integrated circuit die production process may be separate and independent from each other. In the design phase, the integrated circuit die must be designed to have a surface area large enough to accommodate the microcircuitry that will be included in the integrated circuit. The designer will typically choose dimensions that provide a size and shape that provide the required surface area, but may pay lesser regard to selecting dimensions that, along with providing the required surface area, also maximize the gross number of dies per wafer.

In some instances in the prior art, an effort may be made to coordinate the design phase with the fabrication phase. Generally, this effort consists of relatively informal discussions between the various departments involved. As might be expected, this coordination may not always take place. However, even in those cases where a more formal process is used to coordinate design and fabrication, the prior art is still problematic because the dimensions of the die are often chosen with the goal of maximizing the number of dies per wafer, without considering the number of stepper shots needed to produce the dies. As described above, it is not always desirable to maximize the number of dies produced per wafer.

Accordingly, what is needed is a method and/or system that can facilitate coordination between the design and fabrication phases of integrated circuit die production. What is also needed is a method and/or system that can accomplish the above need and that can be readily implemented at the front-end (i.e., the design phase or the like) of the die production process. Furthermore, what is needed is a method and/or system that can accomplish the above needs and can maximize the rate of die production based on either or both the number of dies per wafer and the number of stepper shots, depending on the desired utilization of the fabrication facility. The present invention provides a novel solution to the above needs.

These and other objects and advantages of the present invention will become obvious to those of ordinary skill in the art after having read the following detailed description of the preferred embodiments which are illustrated in the various drawing figures.

DISCLOSURE OF THE INVENTION

The present invention provides a method and system thereof that can facilitate coordination between the design and fabrication phases of integrated circuit die production. The present invention also provides a method and system thereof that can be readily implemented at the front-end (i.e., the design phase or the like) of the die production process. Furthermore, the present invention provides a method and system thereof that can maximize the rate of die production based on either or both the number of dies per wafer and the number of stepper shots, depending on the desired utilization of the fabrication facility.

The present embodiment of the present invention pertains to a method and system thereof for maximizing integrated circuit die production. A wafer size, scribe lane width and dimensions for a die are received. A die count (e.g., the gross number of die per wafer) and a stepper shot count corresponding to the dimensions are determined using one or more lookup tables. A lookup table is associated with each combination of wafer size and scribe lane width. A measure of die production is calculated using the die count and the stepper shot count. The dimensions can be changed and a new measure of die production calculated using the changed dimensions, until a maximum value of the measure of die production is determined.

In one embodiment, the measure of die production is determined by dividing the die count by the stepper shot count.

In one embodiment, an identifier is used to indicate a type of integrated circuit die production method, and the scribe lane width associated with this identifier is retrieved from a database and used with the lookup tables to determine the die count and the stepper shot count.

In one embodiment, the method is implemented on a server computer system in a client-server computer system network. In this embodiment, the server computer system receives from a client computer system the wafer size, scribe lane width, and die dimensions. The measure of die production is calculated and transmitted to the client computer system.

In one embodiment, to generate the lookup tables, a range of die lengths and widths is specified, and an initial value of die length and width is selected from within the range. An identifier indicating a type of stepper is received, and a stepper field size limit associated with the identifier is retrieved from a database. A die matrix of reticle images is modeled using the stepper field size limit, the length and width for a die, and a scribe lane width. A die count is calculated for each of a plurality of different offsets of the die matrix measured relative to a fixed location on a wafer. The optimum value of these die counts is selected and stored in a first lookup table. A stepper shot count is calculated for the offset corresponding to the optimum die count and stored in a second lookup table. Similar calculations are performed for the range of different die lengths and widths in order to build the lookup tables.

BRIEF DESCRIPTION OF THE DRAWINGS

The accompanying drawings, which are incorporated in and form a part of this specification, illustrate embodiments of the invention and, together with the description, serve to explain the principles of the invention.

PRIOR ART

BEST MODE FOR CARRYING OUT THE INVENTION

Figure 1:
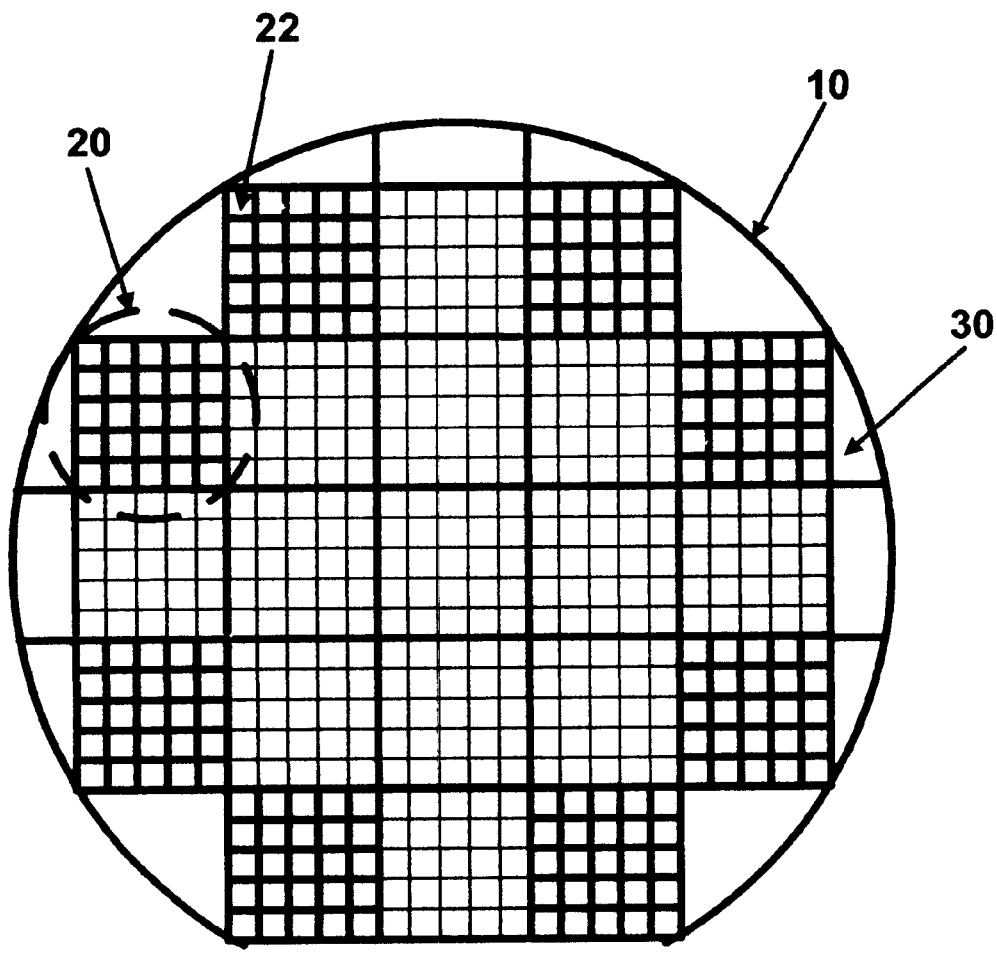
FIG. 1 illustrates one embodiment of a silicon wafer on which a pattern of integrated circuit dies have been laid out.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, fragments, pixels, or the like.

As used herein, a transaction refers to the transmission or receipt of data or other such message information. The transaction may consist of all data associated with a particular computer system operation (e.g., a request or command). A transaction may also consist of a block of data associated with a particular operation; for example, a transfer of data may be broken down into several blocks of data, each block transferred prior to the transfer of a subsequent block, and each block making up a transaction.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "receiving," "using," "calculating," "retrieving," "building," "selecting," "storing" or the like, refer to actions and processes (e.g., the processes of FIGS. 5 and 6 ) of a computer system or similar electronic computing device. The computer system or similar electronic computing device manipulates and transforms data represented as physical (electronic) quantities within the computer system memories, registers or other such information storage, transmission or display devices. The present invention is well suited to the use of other computer systems.

The present invention is discussed in the context of a server computer system and a client computer system communicatively coupled via a client-server computer system network. The computer system network may be an Internet type of network, implemented over the World Wide Web for example. Alternatively, the computer system network may be an Intranet type of network, implemented within the boundaries of a company, for example, and therefore accessible only from within the company. However, it is appreciated that the present invention is suited for methods of implementation in other types of computer system networks, and the present invention is also suited for implementations other than in a computer system network.

Figure 2A:
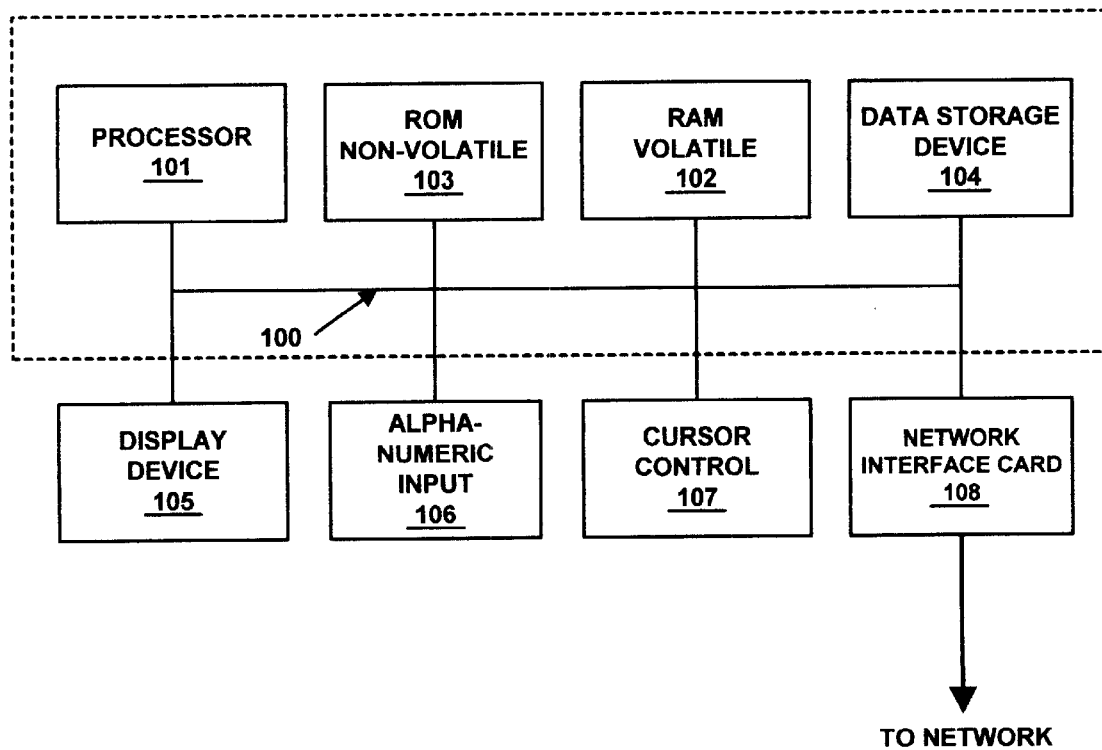
FIG. 2A is a block diagram of an exemplary computer system upon which embodiments of the present invention may be practiced.

Refer now to FIG. 2A which illustrates an exemplary computer system 190 upon which embodiments of the present invention may be practiced. In general, computer system 190 comprises bus 100 for communicating information, processor 101 coupled with bus 100 for processing information and instructions, random access (volatile) memory 102 coupled with bus 100 for storing information and instructions for processor 101, read-only (non-volatile) memory 103 coupled with bus 100 for storing static information and instructions for processor 101, data storage device 104 such as a magnetic or optical disk and disk drive coupled with bus 100 for storing information and instructions, an optional user output device such as display device 105 coupled to bus 100 for displaying information to the computer user, an optional user input device such as alphanumeric input device 106 including alphanumeric and function keys coupled to bus 100 for communicating information and command selections to processor 101, and an optional user input device such as cursor control device 107 coupled to bus 100 for communicating user input information and command selections to processor 101. Furthermore, a network interface card (NIC) 108 is used to couple computer system 190 onto, for example, a client-server computer system network. In such a network, computer system 190 can exemplify a client computer system and/or a server computer system.

Display device 105 utilized with computer system 190 may be a liquid crystal device, cathode ray tube, or other display device suitable for creating graphic images and alphanumeric characters recognizable to the user. Cursor control device 107 allows the computer user to dynamically signal the two-dimensional movement of a visible symbol (pointer) on a display screen of display device 105. Many implementations of the cursor control device are known in the art including a trackball, mouse, joystick or special keys on alphanumeric input device 106 capable of signaling movement of a given direction or manner of displacement. It is to be appreciated that the cursor control 107 also may be directed and/or activated via input from the keyboard using special keys and key sequence commands. Alternatively, the cursor may be directed and/or activated via input from a number of specially adapted cursor directing devices.

Figure 2B:
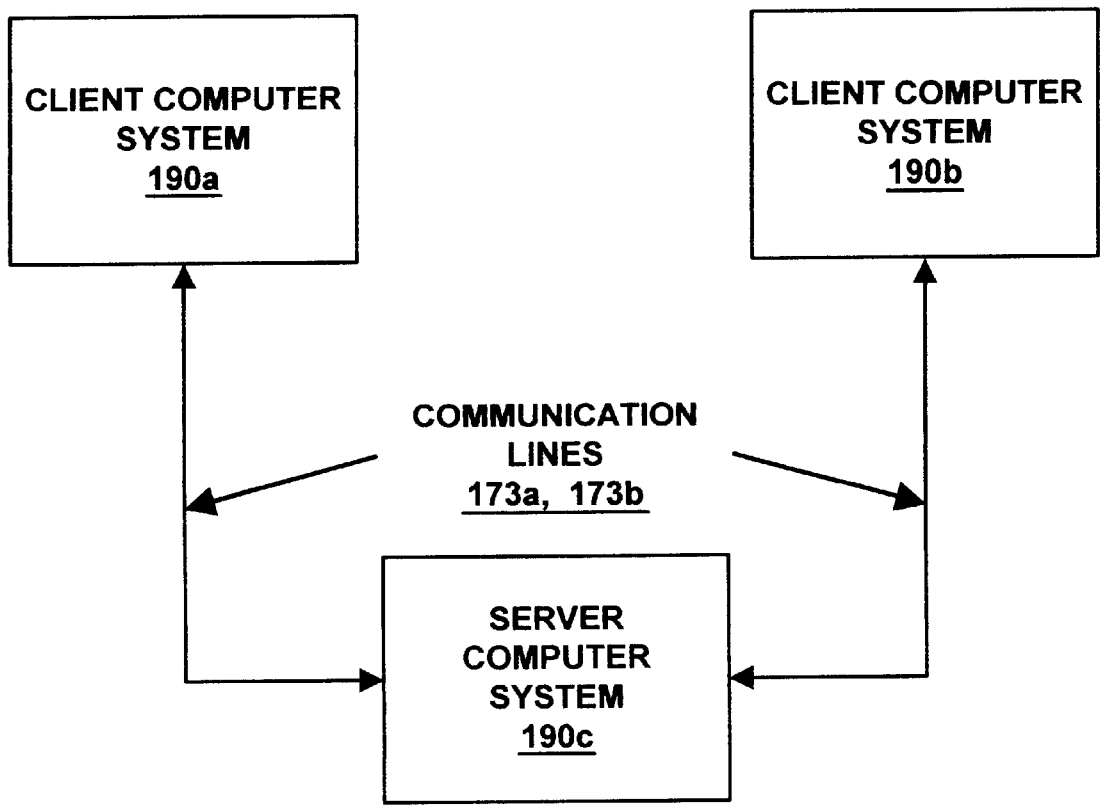
FIG. 2B is a block diagram illustrating an exemplary client-server computer system network upon which embodiments of the present invention may be practiced.

FIG. 2B is a block diagram illustrating an exemplary client-server computer system network 170 ("network 170") upon which embodiments of the present invention may be practiced. Network 170 may be a communication network located within a firewall of an organization or corporation. Client (or user) computer systems 190a and 190b and server computer system 190c are communicatively coupled via communication lines 173a and 173b through any of a variety of means known in the art. For example, this coupling can be accomplished over any network protocol that supports a persistent network connection, such as TCP (Transmission Control Protocol), NetBIOS, IPX (Internet Packet Exchange), and LU6.2, and link layers protocols such as Ethernet, token ring, and ATM (Asynchronous Transfer Mode). Alternatively, client computer systems 190a and 190b can be coupled to server computer system 190c via an input/output port (e.g., a serial port) of server computer system 190c.

Figure 3:
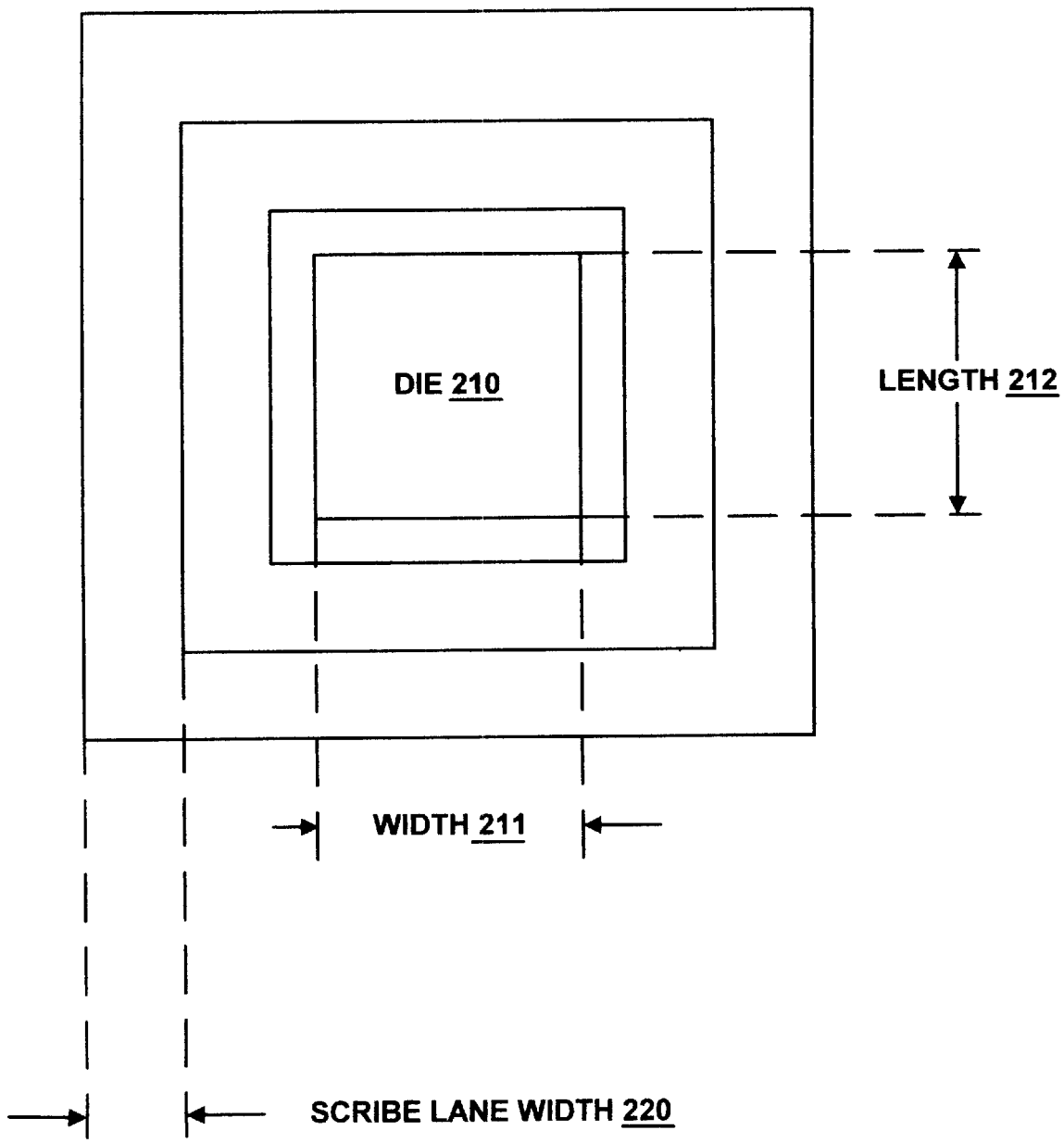
FIG. 3 shows the general layout of a single integrated circuit die layout in accordance with one embodiment of the present invention.

FIG. 3 shows the general layout of a single integrated circuit die layout 200 on a wafer (not shown). It is appreciated that die layout 200 is not to scale. Die layout 200 comprises integrated circuit die 210, which has a length 212 and width 211. Die 210 is typically surrounded by an area for the input/output pads and a guard ring. Significantly, layout 200 also includes a scribe lane of width 220. The scribe lane contains inserts and production marks (not shown) used during the manufacture of integrated circuit dies from a wafer. When die layout 200 is stepped around the wafer during manufacture, the scribe lane is overlaid from side to side and from top to bottom. As is known in the art, the scribe lane width is a function of the type of production method being used (e.g., ceramic package, plastic package, narrow scribe, stepper type, and the like). Accordingly, the number of dies 210 that can be manufactured on a wafer requires consideration of not only the length and width of die 210 but also the scribe lane width, which itself is dependent on other factors such as production method.

Figure 4:
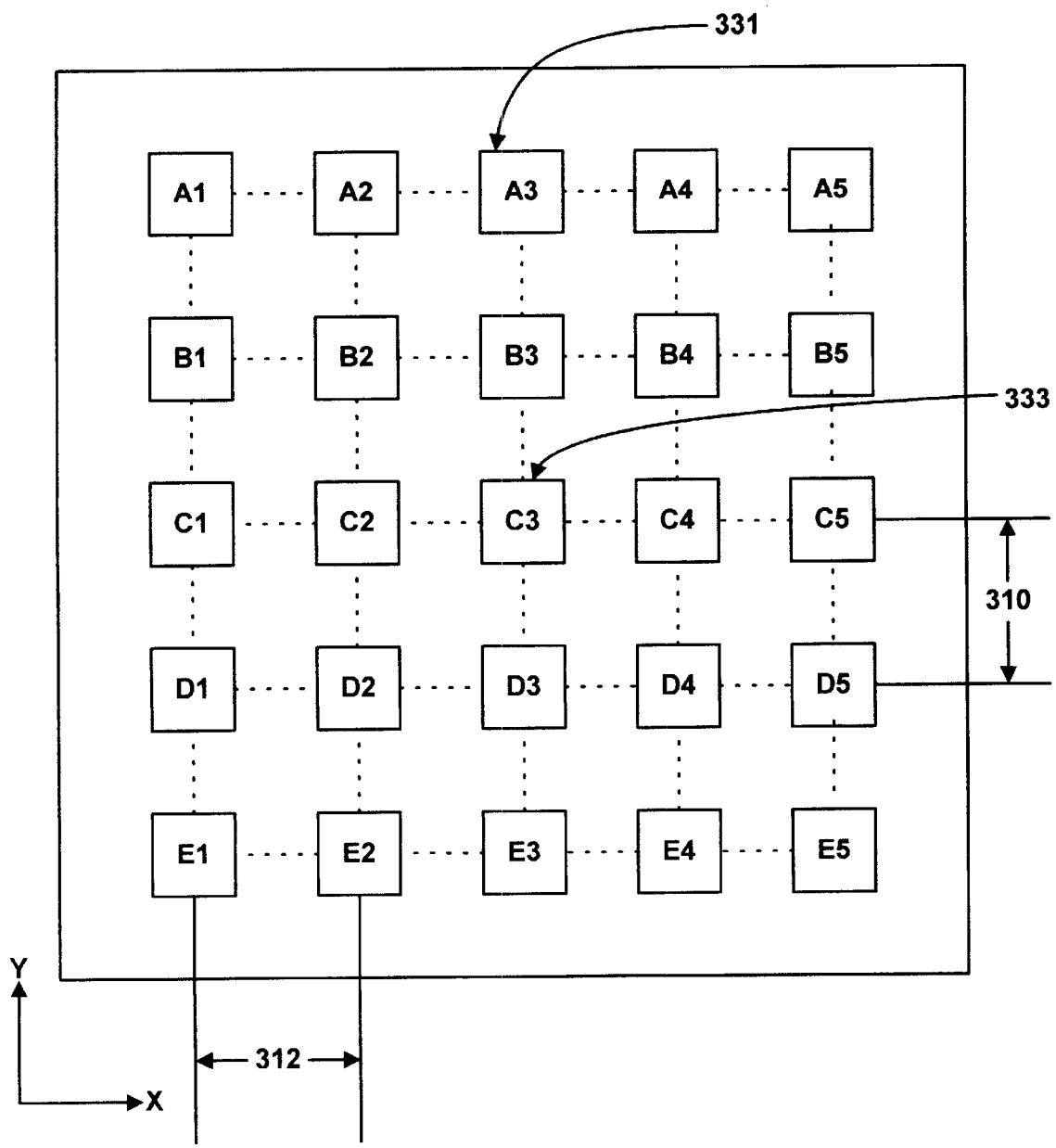
FIG. 4 illustrates a top view of one shot of a die matrix of reticle images in accordance with one embodiment of the present invention.

With reference now to FIG. 4, one stepper shot of a die matrix 300 (a matrix of reticle images) is shown in accordance with one embodiment of the present invention. FIG. 4 shows a top view of die matrix 300. Typically, die matrix 300 includes a multiple number of rows and columns of pattern boxes (exemplified by 331 and 333 ); however, it is appreciated that a die matrix may include only a single row and/or a single column. In FIG. 4, a five-by-five matrix is shown; however, it is appreciated that other matrix sizes may be used in accordance with the present invention. The pattern boxes are separated from one another by a constant pitch 310 in one direction (e.g., the y-direction) and a constant pitch 312 in the other direction (e.g., the x-direction), although the pitch can be variable in other embodiments. It is appreciated that the pitches 310 and 312 are exaggerated in FIG. 4 for purposes of clarity. In addition, while the present embodiment shows a specific configuration and spacing of regularly shaped pattern boxes, in other embodiments the die matrix may have other patterns, configurations and spacing.

Figure 5:
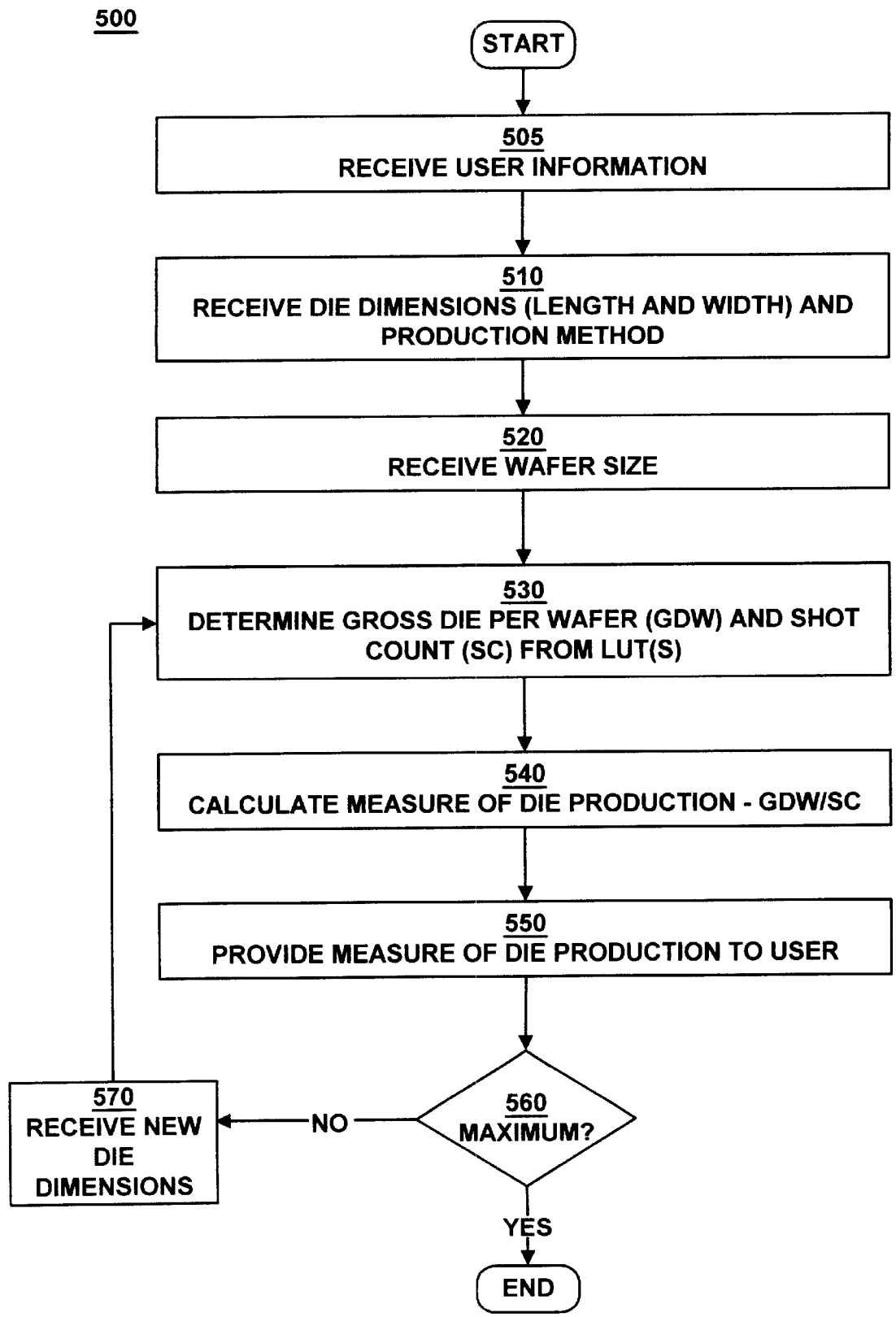
FIG. 5 is a flowchart of the steps in a process for maximizing integrated circuit die production in accordance with one embodiment of the present invention.

FIG. 5 is a flowchart of the steps in a process 500 for maximizing integrated circuit die production in accordance with one embodiment of the present invention. Process 500 an be implemented via computer-readable program instructions stored in a memory unit (e.g., random access memory 102, read-only memory 103, and/or data storage device 104) and executed by processor 101 of computer system 190 (FIG. 2A).

In one embodiment, process 500 is implemented on a server computer system exemplified by computer system 190. In this embodiment, a user accesses the server computer system from a client computer system communicatively coupled to the server computer system via a client-server computer system network (e.g., network 170 of FIG. 2B). Such client-server computer system networks are well known in the art.

In step 505 of FIG. 5, the user provides user information such as a user identification ("user ID"), a part number, the user's location, and other like information that can be used for logon purposes, as well as for purposes of maintaining logs and records. In one embodiment, this information is input by the user from a client computer system and received at the server computer system in accordance with the present invention.

In step 510, proposed dimensions (specifically, length and width) for the integrated circuit die are received from the user (see FIG. 3). In one embodiment, the user can also specify scribe lane width. As above, in one embodiment, the user inputs this information at a client computer system, and the information is received at the server computer system. In one embodiment, the different types of production methods are each uniquely identified and listed in a database with their respective scribe lane width. In that embodiment, a user specifies the production method, and the scribe lane width associated with the selected production method is retrieved from the database.

In step 520 of FIG. 5, the wafer size that will be used for the fabrication of the integrated circuit dies is received. In the present embodiment, the wafers are either six inches or eight inches in diameter; however, it is appreciated that other sizes may be used in accordance with the present invention. In one embodiment, the wafer size is specified by the user as described above.

In step 530, in the present embodiment of the present invention, the gross number of dies per wafer ("die count") is determined from a lookup table using the die dimensions specified in step 510. Different lookup tables exist for each production method (that is, for each scribe lane width). The lookup table also corresponds to the wafer size specified in step 520. In this embodiment, the lookup table is an array with the length-wise dimensions incremented along one axis and the width-wise dimensions incremented along the other. If a dimension is specified that falls within the range between increments, the dimension is rounded up to the next highest value in order to provide a conservative prediction of the number of dies that will fit on the wafer.

Also in step 530, the number of stepper shots ("stepper shot count") associated with the die dimensions of step 510 is determined from a lookup table in a manner similar to that described in the preceding paragraph. In the present embodiment, separate lookup tables are used to determine the number of dies per wafer and the number of stepper shots. However, it is appreciated that, in other embodiments, the lookup tables may be combined.

In the present embodiment, lookup tables are used because, for instance, the computations can be completed beforehand and stored (as described in conjunction with FIG. 6), thereby reducing the computational resources required to implement process 500. It is appreciated, however, that the number of dies per wafer and the number of stepper shots can be alternatively calculated in accordance with the present invention.

In step 540, a measure of die production is calculated. In the present embodiment, the measure of die production is wafer productivity, which is the gross number of dies per wafer (step 530) divided by the number of stepper shots (step 530). However, it is appreciated that, in other embodiments, other measures of die production may be used in accordance with the present invention.

In step 550, the wafer productivity calculated in step 540 is provided and displayed to the user. In one embodiment, the user receives this information at a client computer system from a server computer system.

In steps 560 and 570, the user may change the proposed dimensions of the integrated circuit die in order to calculate a new value of wafer productivity. Thus, process 500 is an iterative process in which varying die dimensions are input by a user until a maximum or nearly maximum value of wafer productivity is determined.

Because many stepper field limits are rectangular, it is possible to see an increase in wafer productivity by rotating the dimensions of a non-square die. In one embodiment, the present invention automatically rotates the specified dimensions (from step 510) by 90 degrees—that is, the specified length is made the width, and the specified width is made the length. The number of dies per wafer, the number of stepper shots, and the resultant wafer productivity are calculated for the rotated dimensions. If the rotated dimensions yield a higher value for wafer productivity, this is reported to the user with a suggestion to rotate the die by 90 degrees for fabrication.

Once a maximum value of wafer productivity is determined, the user can terminate process 500. The dimensions for the integrated circuit die corresponding to this value of wafer productivity can then be used in the remainder of the design process.

Thus, in accordance with the present invention, a designer of integrated circuits can determine the impact a design decision (specifically, the selection of the dimensions for an integrated circuit die) can have on the fabrication of the integrated circuit die. As a result, the present embodiment of the present invention can facilitate coordination between the design and fabrication phases of integrated circuit die production. In one embodiment, the present invention is implemented on a server computer system that is readily accessible to the designer over a computer system network via a client computer system. Thus, the present invention can be readily implemented at the front end (e.g., during the design phase) of the die production process.

Furthermore, the present embodiment of the present invention can maximize the rate of die production based on either or both the number of dies per wafer and the number of stepper shots, depending on the desired utilization of the fabrication facility. A designer can select die dimensions that maximize the number of dies per wafer or that minimize the number of stepper shots, or the designer can select die dimensions that maximize the measure of die production that appropriately considers the optimum combination of dies per wafer and number of stepper shots (that is, the designer can select die dimensions that result in less than the maximum number of dies per wafer or more than the minimum number of stepper shots, but that optimizes the measure of die production).

Figure 6:
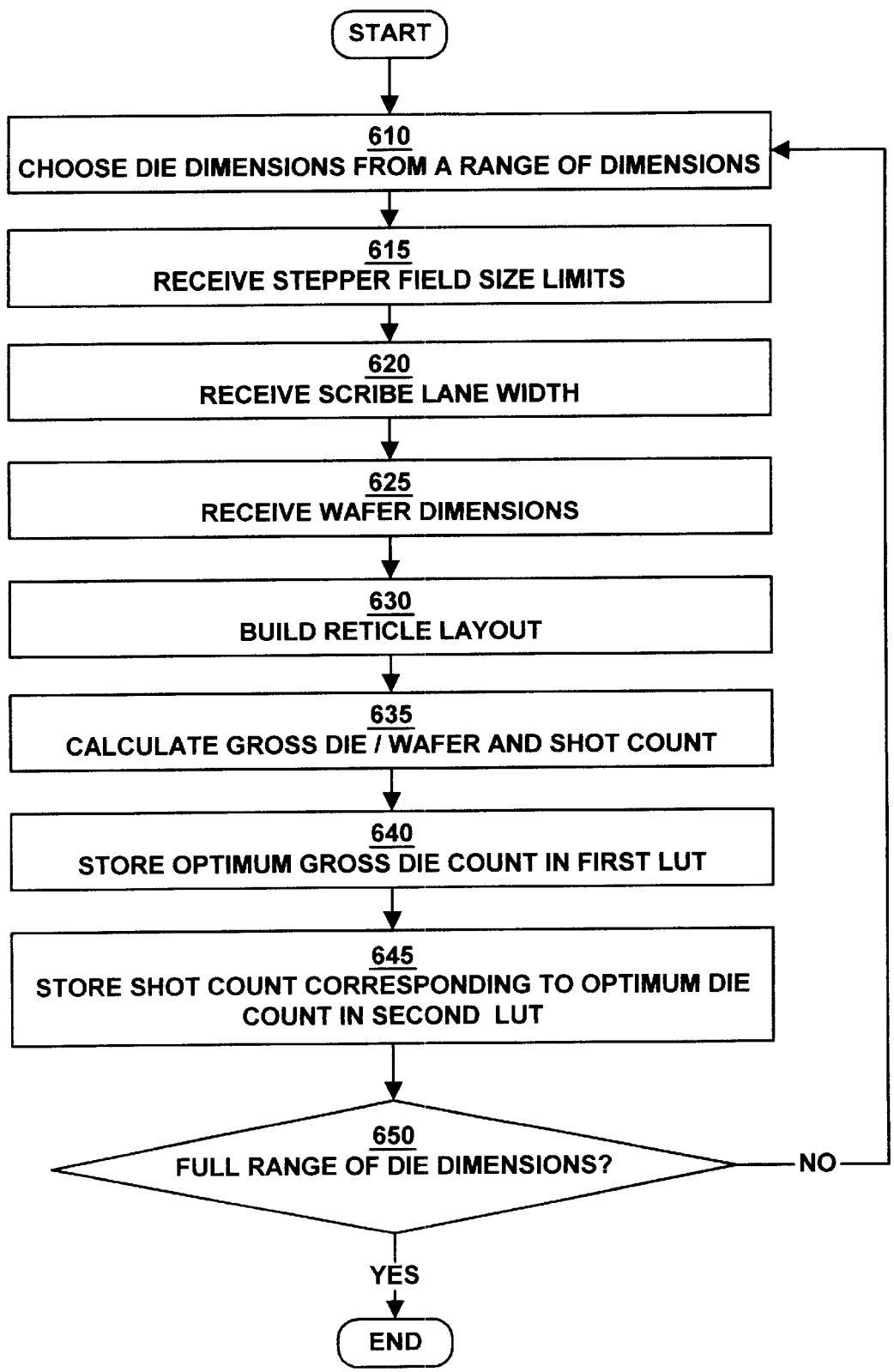
FIG. 6 is a flowchart of the steps in a process for generating lookup tables used in the process of FIG. 5 in accordance with one embodiment of the present invention.

FIG. 6 is a flowchart of the steps in a process 600 for generating lookup tables used in process 500 (FIG. 5) in accordance with one embodiment of the present invention. Process 600 can be implemented via computer-readable program instructions stored in a memory unit (e.g., random access memory 102, read-only memory 103, and/or data storage device 104) and executed by processor 101 of computer system 190 (FIG. 2A). Note that, in the present embodiment, it is not necessary for process 600 to be implemented on the same computer on which process 500 is implemented. Instead, the lookup tables can be generated using process 600 and stored on one computer system, and then accessed by another computer system that is implementing process 500.

In step 610 of FIG. 6, in the present embodiment, a range of possible dimensions for an integrated circuit die is identified. That is, the range of dimensions to be stored in the lookup tables is identified. For example, the minimum possible and maximum possible length and width are identified. A first set of dimensions is selected from the range of dimensions identified. For example, the first set of dimensions could consist of the minimum length and the minimum width of the range being considered.

In step 615, the stepper field size limit is specified. In one embodiment, the different types of wafer steppers that are used in fabrication are each uniquely identified and listed in a database with their respective stepper field size limit. In this embodiment, a user specifies the type of wafer stepper by selecting its identifier, and the stepper field size associated with the selected stepper is retrieved from the database.

In step 620, the scribe lane width is specified. In one embodiment, the different types of production methods (e.g., ceramic package, plastic package, narrow scribe, stepper type, and the like) are each uniquely identified and listed in a database with their respective scribe lane width. In this embodiment, a user specifies the production method by selecting its identifier, and the scribe lane width associated with the selected production method is retrieved from the database.

In step 625, the wafer dimension (e.g., six-inch or eight-inch diameter) is specified.

In step 630, a die matrix (e.g., die matrix 300 of FIG. 4) is modeled using the set of die dimensions from step 610 and the stepper field size limit (step 615).

In step 635, the die matrix is overlaid on the wafer using a prescribed offset relative to a fixed location on the wafer. For example, the offset may be measured relative to the center of the wafer. The amount of offset is specified for the x-direction and the y-direction (see FIG. 4). The offset can be initially prescribed to be zero in both the x-direction and the y-direction, for example, in which case the center of the matrix of reticle layouts lies over the center of the wafer.

Continuing with step 635 of FIG. 6, the gross number of die per wafer and the number of stepper shots are calculated for the prescribed offset using the present layout for the die matrix (step 630, which incorporates the die element size and stepper field size limit) and the present wafer diameter (step 625).

If the offset is not at its maximum value, a new value is specified for the offset, and the gross number of die per wafer and the number of stepper shots are calculated for the new offset using the present die matrix and wafer diameter. A new value of the offset is specified, for example, by maintaining the same offset in the x-direction and increasing the offset in the y-direction. When the offset in the y-direction reaches its maximum value, the 'y' value is reset to its initial value and the 'x' value is increased. These steps are repeated until the full range of offsets is evaluated. Thus, for each offset evaluated, the die count per wafer and the shot count are determined using the present values for die dimensions, wafer size, and stepper field size limit. In the present embodiment, the maximum offset in the x-direction and the y-direction are equivalent to one-half the length of the die and one-half the width of the die specified in step 610.

In step 640, in the present embodiment, once the full range of offsets have been considered, the optimum value for the die count corresponding to the present values for the die dimensions (step 610) is stored in a first lookup table. The optimum value may be the maximum value calculated for the die count, although it is appreciated that it may not necessarily be the maximum value. For example, the maximum die count may correspond to a particular amount of offset, but a slight deviation from that particular offset may significantly affect the die count. In this case, it might be more desirable to select a die count not as significantly affected by deviations in the offset.

In step 645, in the present embodiment, the stepper shot count corresponding to the die count selected in step 640 is stored in a second lookup table. It is appreciated that, in other embodiments, the lookup tables may be combined.

In step 650, if the full range of die dimensions specified in step 610 has not been evaluated, process 600 is repeated for the next set of dimensions. That is, the length or width is increased by an incremental amount and a value of maximum die count and the corresponding shot count are calculated and stored, as described above. Steps 610 through 645 of process 600 are repeated until the full range of dimensions (length and width) is evaluated.

Process 600 is performed for each combination of wafer size and scribe lane width (or production method), so that lookup tables are generated for each such combination. Thus, for example, lookup tables for die count and stepper shot count are generated for a six-inch wafer and the scribe lane width associated with the ceramic package production method, for an eight-inch wafer and plastic package, and so on. The lookup tables contain the maximum die count or stepper shot count for a full range of possible die lengths and widths.

Table 1 provides an example demonstrating the results of calculations performed using the processes of FIGS. 5 and 6 in accordance with one embodiment of the present invention. For an initially proposed die size of x=250 mils and y=200 mils, the following exemplary results are obtained.

TABLE 1

Exemplary Calculations and Results

| x | y | Die Count | Shot Count | Wafer Productivity |
|---|---|---|---|---|
| 250 | 200 | 799 | 81 | 9.86 |
| 200 | 250 | 802 | 104 | 7.71 |

In this example, the greatest productivity is realized with x=250 mils and y=200 mils. Even though rotating the die dimensions yields three more die per wafer, 23 more stepper shots are needed. For a condition in which the fabrication facility is fully loaded, the higher throughput of wafers associated with x=250 mils and y=200 mils is more advantageous than the extra dies per wafer.

Table 2 provides another example of the application of the processes of FIGS. 5 and 6 in accordance with one embodiment of the present invention. For an initially proposed die size of x=325 mils and y=200 mils, the following results are obtained.

TABLE 2

Exemplary Calculations and Results

| x | y | Die Count | Shot Count | Wafer Productivity |
|---|---|---|---|---|
| 325 | 200 | 612 | 116 | 5.28 |
| 200 | 325 | 612 | 81 | 7.56 |
| 255 | 255 | 616 | 81 | 7.60 |

The example of Table 2 shows that by rotating the dimensions of the die from the initially proposed values, the die count is not changed, but the stepper shot count is reduced by 30 percent. In addition, changing the die dimensions to x=255 mils and y=255 mils (which maintains the same die area) increases the die count by four without changing the stepper shot count.

In summary, the present invention provides a method and system thereof for maximizing integrated circuit die production per wafer. Based on a wafer size, scribe lane width and die dimensions, a die count (the gross number of die per wafer) and a stepper shot count corresponding to the dimensions are determined using one or more lookup tables. A measure of die production (e.g., wafer productivity) is calculated using the die count and the stepper shot count. The die dimensions can be changed and a new measure of die production calculated using the changed dimensions until a maximum value for the measure of die production is calculated.

The present invention thus provides a method and system thereof that can facilitate coordination between the design and fabrication phases of integrated circuit die production. The present invention also provides a method and system thereof that can be readily implemented at the front end (e.g., the design phase) of the die production process. Furthermore, the present invention provides a method and system thereof that can maximize the rate of die production based on either or both the number of dies per wafer and the number of stepper shots, depending on the desired utilization of the fabrication facility.

The preferred embodiment of the present invention, method and system for varying die shape to increase wafer productivity, is thus described. While the present invention has been described in particular embodiments, it should be appreciated that the present invention should not be construed as limited by such embodiments, but rather construed according to the following claims.

What is claimed is:

1. A method for maximizing integrated circuit die production, said method comprising the steps of:
   a) receiving dimensions for a die;
   b) receiving a wafer size and a scribe lane width;
   c) using one or more lookup tables to determine a die count and a stepper shot count corresponding to said dimensions, wherein a lookup table is associated with each combination of wafer size and scribe lane width;
   d) calculating a measure of die production using said die count and said stepper shot count;
   e) receiving changed dimensions and repeating said steps a) through d) for said changed dimensions; and
   f) repeating said steps a) through e) until a maximum value of said measure of die production is determined.

2. The method for maximizing integrated circuit die production as recited in claim 1 wherein said step b) further comprises the steps of:
   b1) receiving an identifier indicating a type of integrated circuit die production method; and
   b2) retrieving from a database a scribe lane width associated with said type of integrated circuit die production method.

3. The method for maximizing integrated circuit die production as recited in claim 1 wherein said step c) further comprises the steps of, for each combination of wafer size and scribe lane width:
   c1) receiving a stepper field size;
   c2) building a die matrix of reticle images using said stepper field size, a length and a width for a die, and a scribe lane width;
   c3) calculating a die count for each of a plurality of different offsets of said die matrix, said offsets measured relative to a fixed location on a wafer;
   c4) selecting an optimum die count from said step c3); and
   c5) storing said optimum die count in a first lookup table, said optimum die count corresponding to said length and said width.

4. The method for maximizing integrated circuit die production as recited in claim 3 wherein said step c1) comprises the steps of:

receiving an identifier indicating a type of stepper; and retrieving from a database a stepper field size associated with said type of stepper.

5. The method for maximizing integrated circuit die production as recited in claim 3 wherein said offsets are measured from the center of a wafer.

6. The method for maximizing integrated circuit die production as recited in claim 3 wherein said offsets of said step c3) do not exceed one-half of said length when said offsets are measured in a length-wise direction and one-half of said width when said offsets are measured in a width-wise direction.

7. The method for maximizing integrated circuit die production as recited in claim 3 further comprising the steps of:
   c6) calculating a stepper shot count for an offset corresponding to said optimum die count; and
   c7) storing said stepper shot count for said offset in a second lookup table.

8. The method for maximizing integrated circuit die production as recited in claim 1 wherein said step d) comprises the step of:
   calculating said measure of die production by dividing said die count by said stepper shot count.

9. The method for maximizing integrated circuit die production as recited in claim 1 wherein said step e) further comprises the step of:
   automatically rotating said dimensions for said die by 90 degrees when a width and a length of said die are not equal.

10. The method for maximizing integrated circuit die production as recited in claim 1 wherein said method is implemented in a server computer system in a client-server computer system network, said server computer system receiving said dimensions, said wafer size and said scribe lane width from a client computer system and providing said measure of die production to said client computer system.

11. A computer system comprising:
    a bus;
    a processor coupled to said bus; and
    a memory unit coupled to said bus, said processor for executing a method for maximizing integrated circuit die production, said method comprising the steps of:
    a) receiving dimensions for a die;
    b) receiving a wafer size and a scribe lane width;
    c) using one or more lookup tables to determine a die count and a stepper shot count corresponding to said dimensions, wherein a lookup table is associated with each combination of wafer size and scribe lane width;
    d) calculating a measure of die production using said die count and said stepper shot count;
    e) receiving changed dimensions and repeating said steps a) through d) or said changed dimensions; and
    f) repeating said steps a) through e) until a maximum value of said measure of die production is determined.

12. The computer system of claim 11 wherein said step b) of said method further comprises the steps of:
    b1) receiving an identifier indicating a type of integrated circuit die production method; and
    b2) retrieving from a database a scribe lane width associated with said type of integrated circuit die production method.

13. The computer system of claim 11 wherein said step c) of said method of further comprises the steps of, for each combination of wafer size and scribe lane width:

c1) receiving a stepper field size;

c2) building a die matrix of reticle images using said stepper field size, a length and a width for a die, and a scribe lane width;

c3) calculating a die count for each of a plurality of different offsets of said die matrix, said offsets measured relative to a fixed location on a wafer;

c4) selecting an optimum die count from said step c3); and c5) storing said optimum die count in a first lookup table, said optimum die count corresponding to said length and said width.

14. The computer system of claim 13 wherein said step c1) of said method comprises the steps of:

receiving an identifier indicating a type of stepper; and retrieving from a database a stepper field size associated with said type of stepper.

15. The computer system of claim 13 wherein said offsets are measured from the center of a wafer.

16. The computer system of claim 13 wherein said offsets of said step c3) of said method do not exceed one-half of said length when said offsets are measured in a length-wise direction and one-half of said width when said offsets are measured in a width-wise direction.

17. The computer system of claim 13 wherein said method further comprising the steps of:

c6) calculating a stepper shot count for an offset corresponding to said optimum die count; and c7) storing said stepper shot count for said offset in a second lookup table.

18. The computer system of claim 11 wherein said measure of die production is calculated by dividing said die count by said stepper shot count.

19. The computer system of claim 11 wherein said step e) of said method further comprises the step of:

automatically rotating said dimensions for said die by 90 degrees when a width and a length of said die are not equal.

20. The computer system of claim 11 wherein said computer system is a server computer system in a client-server computer system network, said server computer system receiving said dimensions, said wafer size and said scribe lane width from a client computer system and providing said measure of die production to said client computer system.

21. A computer-usable medium having computer-readable program code embodied therein for causing a computer system to perform the steps of:

a) receiving dimensions for a die;

b) receiving a wafer size and a scribe lane width;

c) using one or more lookup tables to determine a die count and a stepper shot count corresponding to said dimensions, wherein a lookup table is associated with each combination of wafer size and scribe lane width;

d) calculating a measure of die production using said die count and said stepper shot count;

e) receiving changed dimensions and repeating said steps a) through d) for said changed dimensions; and f) repeating said steps a) through e) until a maximum value of said measure of die production is determined.

22. The computer-usable medium of claim 21 wherein said computer-readable program code embodied therein causes a computer system to perform the steps of:

b1) receiving an identifier indicating a type of integrated circuit die production method; and b2) retrieving from a database a scribe lane width associated with said type of integrated circuit die production method.

23. The computer-usable medium of claim 21 wherein said computer-readable program code embodied therein causes a computer system to perform the steps of:

c1) receiving a stepper field size;

c2) building a die matrix of reticle images using said stepper field size, a length and a width for a die, and a scribe lane width;

c3) calculating a die count for each of a plurality of different offsets of said die matrix, said offsets measured relative to a fixed location on a wafer;

c4) selecting an optimum die count from said step c3); and c5) storing said optimum die count in a first lookup table, said optimum die count corresponding to said length and said width.

24. The computer-usable medium of claim 23 wherein said computer-readable program code embodied therein causes a computer system to perform the steps of:

receiving an identifier indicating a type of stepper; and retrieving from a database a stepper field size associated with said type of stepper.

25. The computer-usable medium of claim 23 wherein said offsets are measured from the center of a wafer.

26. The computer-usable medium of claim 23 wherein said offsets of said step c3) do not exceed one-half of said length when said offsets are measured in a length-wise direction and one-half of said width when said offsets are measured in a width-wise direction.

27. The computer-usable medium of claim 23 wherein said computer-readable program code embodied therein causes a computer system to perform the steps of:

c6) calculating a stepper shot count for an offset corresponding to said optimum die count; and c7) storing said stepper shot count for said offset in a second lookup table.

28. The computer-usable medium of claim 21 wherein said computer-readable program code embodied therein causes a computer system to perform the step of:

calculating said measure of die production by dividing said die count by said stepper shot count.

29. The computer-usable medium of claim 21 wherein said computer-readable program code embodied therein causes a computer system to perform the step of:

automatically rotating said dimensions for said die by 90 degrees when a width and a length of said die are not equal.

30. The computer-usable medium of claim 21 wherein said computer-readable program code embodied therein is implemented in a server computer system in a client-server computer system network, said server computer system receiving said dimensions, said wafer size and said scribe lane width from a client computer system and providing said measure of die production to said client computer system.

* * * * *